(12) United States Patent
Huang et al.

(10) Patent No.: US 11,289,132 B1
(45) Date of Patent: Mar. 29, 2022

(54) OPERATION METHOD OF MEMORY DEVICE

(71) Applicant: MACRONIX INTERNATIONAL CO., LTD., Hsinchu (TW)

(72) Inventors: Yu-Hung Huang, Tainan (TW); Cheng-Hsien Cheng, Yunlin County (TW); Chih-Chieh Cheng, Zhubei (TW); Yin-Jen Chen, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/168,215

(22) Filed: Feb. 5, 2021

(51) Int. Cl.
*G11C 7/00* (2006.01)
*G11C 11/00* (2006.01)
*G11C 5/14* (2006.01)
*G11C 8/08* (2006.01)

(52) U.S. Cl.
CPC ............... *G11C 5/147* (2013.01); *G11C 8/08* (2013.01)

(58) Field of Classification Search
CPC ....... G11C 5/147; G11C 8/08; G11C 13/0069; G11C 11/1675; G11C 11/2275; G11C 2013/0092
See application file for complete search history.

(56) References Cited

U.S. PATENT DOCUMENTS

| | | | |
|---|---|---|---|
| 2002/0018370 A1* | 2/2002 | Hirano | G11C 16/3468 365/185.29 |
| 2008/0130363 A1* | 6/2008 | Hosono | G11C 16/3418 365/185.2 |
| 2010/0265761 A1* | 10/2010 | Shin | G11C 13/0004 365/163 |

* cited by examiner

*Primary Examiner* — Hien N Nguyen
(74) *Attorney, Agent, or Firm* — McClure, Qualey & Rodack, LLP

(57) ABSTRACT

The present invention discloses an operation method of memory device, applied to a memory device including a number of word lines and one or more functional lines. The operation method includes: receiving a read command for a target memory cell of the memory device; and outputting a signal having a first waveform to a target word line corresponding to the target memory cell to be read among a plurality of the word lines of the memory device, output a signal having a second waveform to the one or more functional lines of the memory device, and output a signal having a third waveform to the word lines other than the target word line. A falling time of the third waveform is longer than a falling time of the first waveform.

6 Claims, 4 Drawing Sheets

OPERATION METHOD OF MEMORY DEVICE

BACKGROUND OF THE INVENTION

Field of the Invention

The invention relates to an operation method of a memory device.

Description of the Related Art

A memory device generally includes a number of bit lines, a number of word lines and a number of memory cells. Each of the memory cells is coupled to a corresponding bit line and a corresponding word line. In a read operation, the charge on the word line corresponding to the memory cell to be read may generally affect the memory cells on its adjacent word line. The effect is called as "hot electron effect". While the read operation has been performed for a number of times, e.g., 10000 times, the accumulated charge generated by the hot electron effect may cause the threshold voltages of the memory cells to shift. In view of this, it is necessary to propose an effective solution to the problem caused by the hot electron effect under the read operation.

SUMMARY OF THE INVENTION

An embodiment of the present invention discloses an operation method of memory device, applied to a memory device including a number of word lines and one or more functional lines. The operation method comprises: receiving a read command for a target memory cell; and outputting a signal having a first waveform to a target word line corresponding to the target memory cell to be read among the word lines, output a signal having a second waveform to the one or more functional lines, and output a signal having a third waveform to the word lines other than the target word line. The second waveform falls from a first voltage level at a first time point, and falls to a second voltage level at a second time point. The third waveform falls from a third voltage level at a third time point, and falls to a fourth voltage level at a fourth time point. A first time interval from the first time point to the second time point is less than a second time interval from the third time point to the fourth time point.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
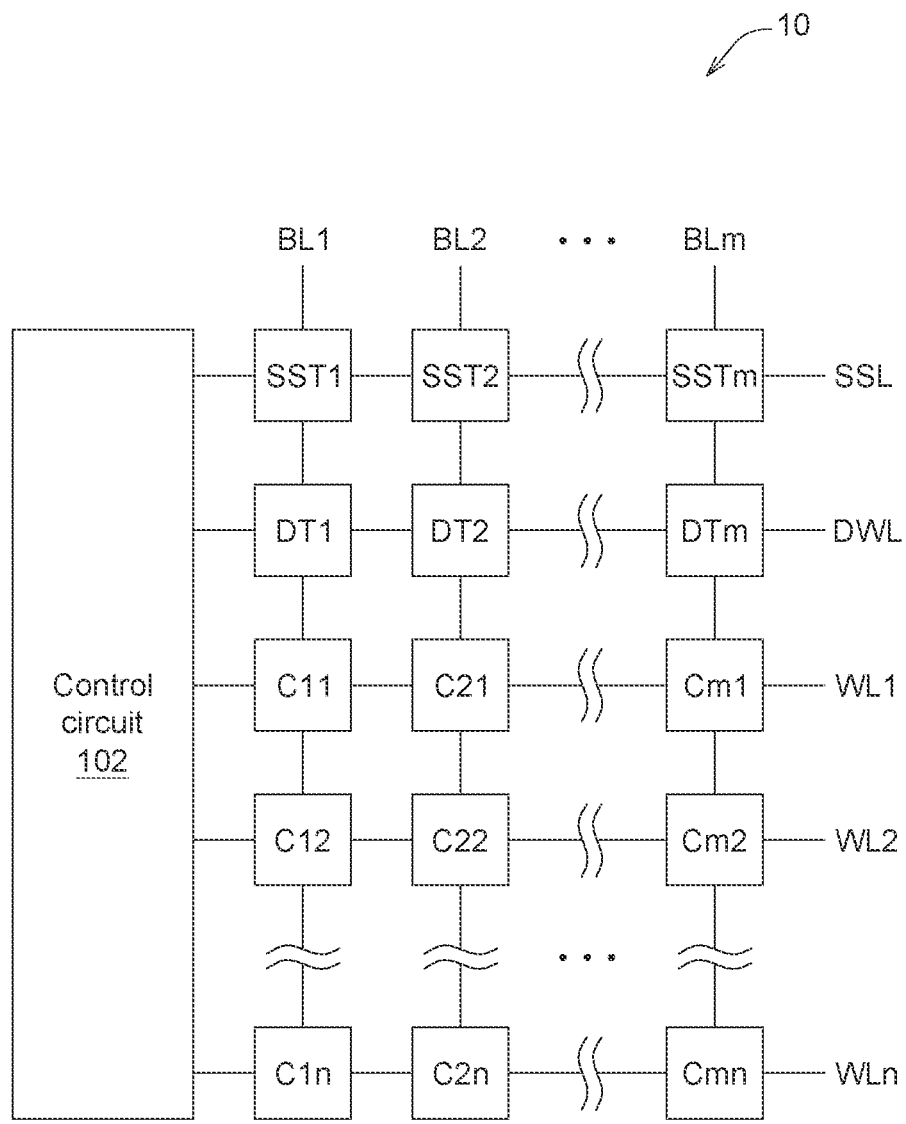
FIG. 1 shows a scheme diagram of a memory device according to an embodiment of the present invention.

Referring to FIG. 1, FIG. 1 shows a scheme diagram of a memory device according to an embodiment of the present invention. The memory device 10 includes m bit lines BL1~BLm, n word lines WL1~WLn, one or more functional lines (SSL, DWL, GSL), a number of memory cells C11~Cmn, a number of functional transistors (SST1~SSTm, DT1~DTm, GST1~GSTm) and a control circuit 102, wherein m, n are positive integers. The memory cells C11~Cmn are configured as m columns and n rows. The memory cells Ci1~Cin of i-th column are coupled to the bit line BLi, and the memory cells Cij~Cmj of the j-th row are coupled to the word line WLj, wherein i=1, 2, . . . , m, j=1, 2, . . . , n.

The functional lines may include one or more string select lines SSL, one or more ground select lines GSL and one or more dummy word lines DWL. The functional transistors may include a number of string select transistors SST1~SSTm, a number of ground select transistors GST1~GSTm and a number of dummy transistors DT1~DTm. The string select transistors SST1~SSTm are coupled to the string select line SSL, and respectively coupled to the bit lines BL1~BLm. The ground select transistors GST1~GSTm are coupled to the ground select line GSL, and respectively coupled to the bit lines BL1~BLm. The dummy transistors DT1~DTm are coupled to the dummy word line DWL, and respectively coupled to the bit lines BL1~BLm. Noted that, in this embodiment, the number of the string select line, the number of the ground select line and the number of the word line are respectively one for illustration, but in different embodiment there may be multiple or no arrangement. For example, in another embodiment, there are three string select lines, one ground select line and two dummy word lines. In other words, the present invention does not limit the quantity of the functional lines and the functional transistors.

The control circuit 102 is coupled to the word lines WL1~WLn and the functional lines. During each read operation period, the control circuit 102 is configured to output a signal having a first waveform A1 to a target word line WL corresponding to a target memory cell Cyx to be read among the word lines WL1~WLn, output a signal having a second waveform A2 to the functional lines, and output a signal having a third waveform A3 to the word lines other than the target word line, wherein x=1, 2, . . . , n, and y=1, 2, . . . , m. The read operation period refers to a time period of performing read operation for reading the target memory cell Cyx. In an embodiment, the control circuit 102 is integrated in a memory controller of the memory device 10.

Figure 2:
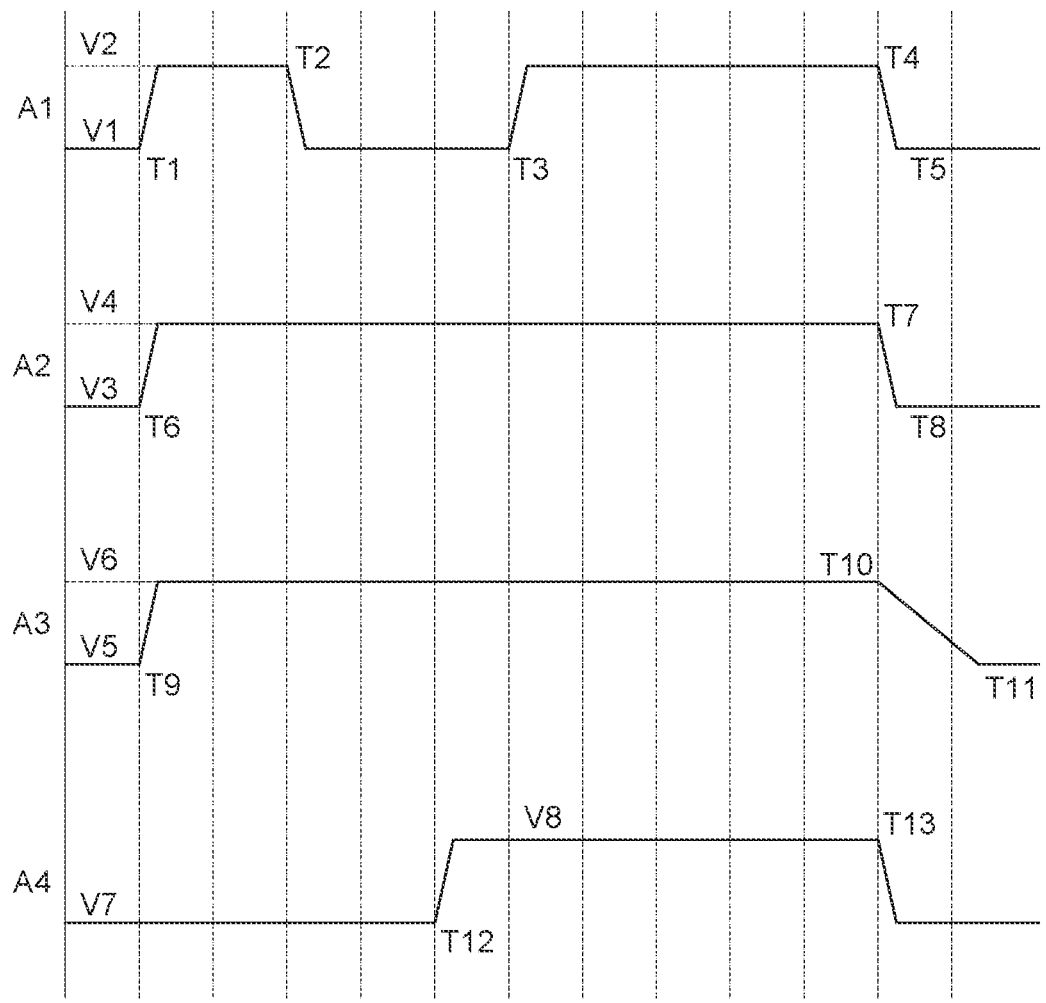
FIG. 2 shows a scheme diagram of a first waveform to a fourth waveform according to an embodiment of the present invention.

Referring to FIG. 2, FIG. 2 shows a scheme diagram of the first waveform, the second waveform, the third waveform and a fourth waveform according to an embodiment of the present invention. This embodiment illustrates when the read operation is performed for the memory cell Cyx, the signal having the first waveform A1 is output to the target word line WLx, the signal having the second waveform A2 is output to the functional line SSL, GSL, DWL and the signal having the third waveform A3 is output to the other word lines, by the control circuit 102, and a signal having the fourth waveform A4 is on the bit line Bly corresponding to the target memory cell Cyx. In FIG. 2, the vertical axis represents voltage, and the horizontal axis represents time.

The first waveform A1 rises from a first voltage level V1 to a second voltage level V2 at a time point T1, falls from the second voltage level V2 to the first voltage level V1 at a time point T2, rises from the first voltage level V1 to the second voltage level V2 at a time point T3, falls from the second voltage level V2 at a time point T4, and falls to the first voltage level V1 at a time point T5, wherein the time point T1 is prior to the time point T2, the time point T2 is prior to the time point T3, the time point T3 is prior to the time point T4, the time point T4 is prior to the time point T5, and the second voltage level V2 is higher than the first voltage level V1.

The second waveform A2 rises from a third voltage level V3 to a fourth voltage level V4 at a time point T6, falls from the fourth voltage level V4 at a time point T7, and falls to the third voltage level V3 at a time point T8, wherein the time point T6 is prior to the time point T7, the time point T7 is prior to the time point T8, and the fourth voltage level V4 is higher than the third voltage level V3.

The third waveform A3 rises a fifth voltage level V5 to a sixth voltage level V6 at a time point T9, falls from the sixth voltage level V6 at a time point T10, and falls to the fifth voltage level V5 at a time point T11, wherein the time point T9 is prior to the time point T10, the time point T10 is prior to the time point T11, and the sixth voltage level V6 is higher than the fifth voltage level V5.

The fourth waveform A4 rises from a seventh voltage level V7 to an eighth voltage level V8 at a time point T12, and at falls from the eighth voltage level V8 to the seventh voltage level V7 at a time point T13, wherein the time point T12 is prior to the time point T13, and the eighth voltage level V8 is higher than the seventh voltage level V7.

In an embodiment, the first voltage level V1, the third voltage level V3 and the fifth voltage level V5 are 0V; the second voltage level V2, the fourth voltage level V4 and the sixth voltage level V6 are 8V; the seventh voltage level V7 is 0.7V, the eighth voltage level is 1.3V; the time point T1, the time point T6 and the time point T9 are the same; the time point T2 is prior to the time point T12, and the time point T12 is prior to the time point T3; the time point T4, the time point T7, the time point T10 and the time point T13 are the same; the time point T8 is prior to the time point T11.

In another embodiment, the first voltage level V1, the third voltage level V3 and the fifth voltage level V5 could be different; the second voltage level V2, the fourth voltage level V6 and the sixth voltage level V6 could be different; the time point T1, the time point T6 and the time point T9 could be different, and the time point T6 is prior to the time point T1 and the time point T9; the time point T2 is prior to the time point T12, and the time point T12 is prior to the time point T3; the time point T4, the time point T7, the time point T10 and the time point T13 could be different, and the time point T7 is prior to the time point T4 and the time point T10; the time point T8 is prior to the time point T11.

Figure 3:
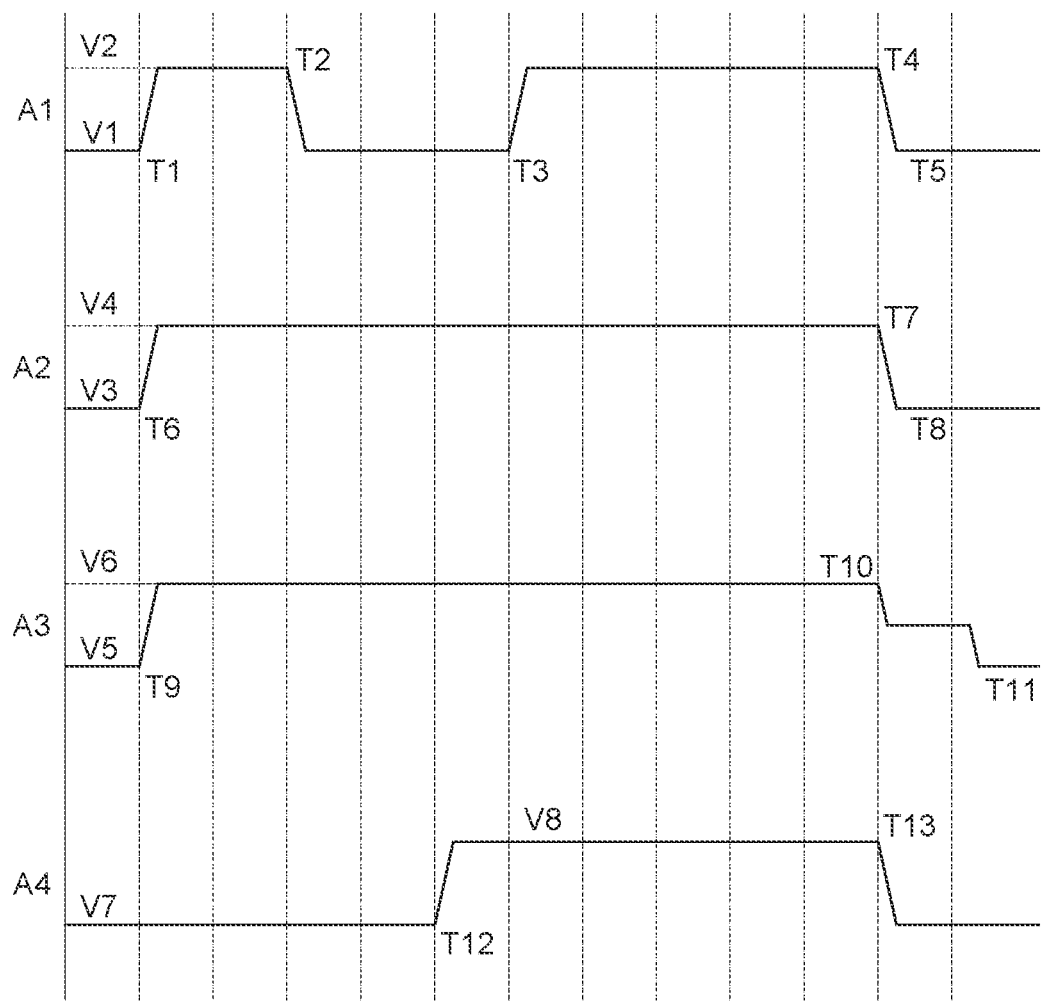
FIG. 3 shows a scheme diagram of a first waveform to a fourth waveform according to another embodiment of the present invention.

More specifically, the main concept of the present invention is to increase the falling time of the signal having the third waveform A3. That is, a time interval from the time point T10 to the time point T11 is longer than a time interval from the time point T7 to the time point T8, and the hot electron effect may be improved. Any other modification on the first waveform A1, the second waveform A2, the third waveform A3 and the fourth waveform A4 is allowable and not limited by the present invention. Between the time point T10 and the time point T11, the third waveform A3 may fall continuously from the sixth voltage level V6 to the fifth voltage level V5 as shown in FIG. 2 with a ramp, or may be fall discontinuously from the sixth voltage level V6 to the fifth voltage level V5 as shown in FIG. 3 with a step.

Preferably, a first time interval t1 from the time point T10 to the time point T11 could be 1%-5% of a second time interval t2 from the time point T9 to the time point T11. For example, the second time interval is 100 us, then the first time interval is preferably not less than 1 us and not greater than 5 us.

Preferably, the eighth time point T8 is prior to the eleventh time point T11 to make sure that the memory cells are turned off after when the functional transistors are turned off.

Figure 4:
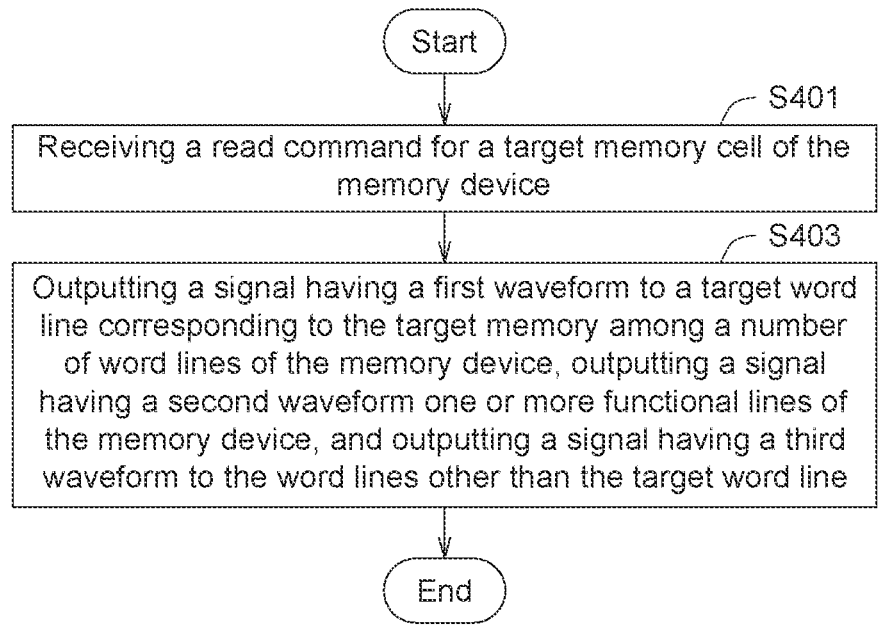
FIG. 4 shows a flow chart of a memory device according to an embodiment of the present invention.

Referring to FIG. 4, FIG. 4 shows a flow chart of an operation method of a memory device according to an embodiment of the present invention. In an embodiment, the operation method could be performed by a control circuit of the memory device, wherein the control circuit could be integrated in a memory controller of the memory device.

In step S401, receiving a read command for a target memory cell of the memory device is performed.

In S403, outputting a signal having a first waveform to a target word line corresponding to the target memory among a number of word lines of the memory device, outputting a signal having a second waveform one or more functional lines of the memory device, and outputting a signal having a third waveform to the word lines other than the target word line is performed.

The details of the first waveform, the second waveform and the third waveform could be referred to the above description, and may not be repeated herein.

Figure 5:
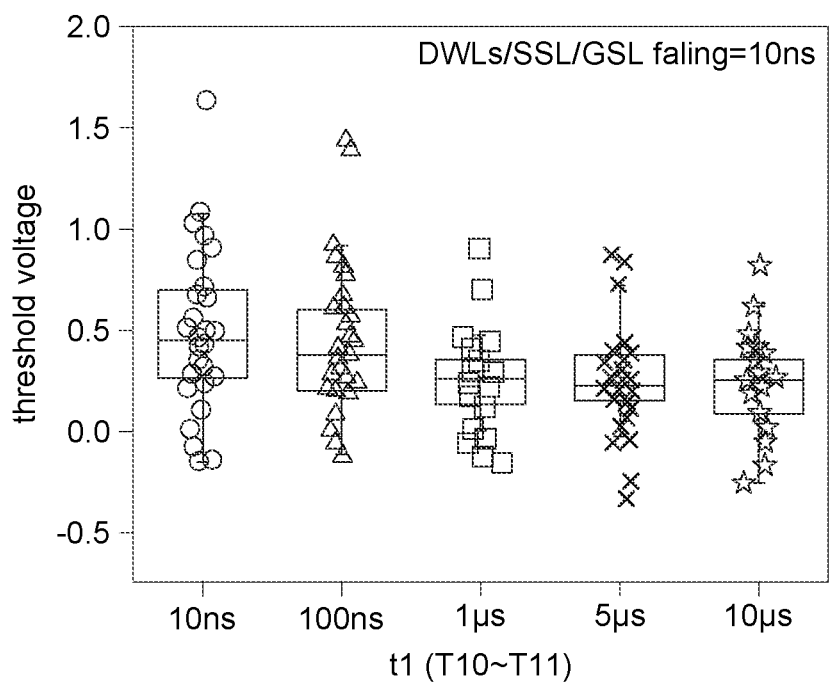
FIG. 5 shows a schematic diagram of a relationship between the falling time of the signal having the third waveform and the threshold voltages of the memory cells on the word lines close to the target memory cell after performing a number of read operations.

Referring to FIG. 5, FIG. 5 shows a schematic diagram of a relationship between the falling time of the signal having the third waveform and the threshold voltages of the memory cells on the word lines close to the target memory cell after performing a number of read operations. The vertical axis represents the threshold voltage of the threshold voltages of the memory cells on the word lines close to the target memory cell (volt). The horizontal axis represents the falling time of the signal having the third waveform, that is, the first time interval t1 from the time point T10 to the time point T11. The falling time of the signal having the second waveform (i.e., the time interval from the time point T7 to the time point T8) is 10 ns. FIG. 5 shows that, when the falling time of the signal having the third waveform is 10 ns, the same as the falling time of the signal having the second waveform, the threshold voltages of the threshold voltages of the memory cells on the word lines close to the target memory cell distribute between −025V to 1.75V; when the falling time of the signal having the third waveform is 100 ns, the threshold voltages of the threshold voltages of the memory cells on the word lines close to the target memory cell are distributed between −025V and 1.5V; when the falling time of the signal having the third waveform is 1 us, the threshold voltages of the threshold voltages of the memory cells on the word lines close to the target memory cell are distributed between −025V and 1V: and when the falling time of the signal having the third waveform is 10 us, the threshold voltages of the threshold voltages of the memory cells on the word lines close to the target memory cell are distributed between −025V and 1V. Concluding the above observations with respect to FIG. 5, it could be seen that when the falling time of the signal having the third waveform is 1 us, a more obvious effect, which make the threshold voltage distribution more shrink, begins to appear. With increasing of the falling time of the signal having the third waveform, the distribution of the threshold voltages of the threshold voltages of the memory cells on the word lines close to the target memory cell shrinks further. When the falling time of the signal having the third waveform is greater than 5 us, the improvement in the effect of shrinking the threshold voltage distribution is relatively insignificant.

With the memory device and the operation method thereof provided by the present invention, the hot electron effect could be improved.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A operation method of memory device, applied to a memory device including a plurality of word lines and one or more functional lines, the operation method comprising:
   receiving a read command for a target memory cell of the memory device; and
   outputting a signal having a first waveform to a target word line corresponding to the target memory cell to be read among the word lines, output a signal having a second waveform to the one or more functional lines, and output a signal having a third waveform to the word lines other than the target word line,
   wherein the second waveform falls from a first voltage level at a first time point, and falls to a second voltage level at a second time point; the third waveform falls from a third voltage level at a third time point, and falls to a fourth voltage level at a fourth time point; and a time interval from the first time point to the second time point is less than a second time interval from the third time point to the fourth time point.

2. The operation method according to claim 1, wherein the second time point is prior to the fourth time point.

3. The operation method according to claim 1, wherein the third waveform rises from the fourth voltage level to the third voltage level at a fifth time point prior to the third time point, and the second time interval is not less than 1% of a third time interval from the fifth time point prior to the sixth time point.

4. The operation method according to claim 1, wherein the third waveform rises from the fourth voltage level to the third voltage level at a fifth time point prior to the third time point, and the second time interval is not greater than 5% of a third time interval from the fifth time point prior to the sixth time point.

5. The operation method according to claim 1, wherein between the third time point and the fourth time point, the third waveform falls from the third voltage level to the fourth voltage level with a ramp.

6. The operation method according to claim 1, wherein between the third time point and the fourth time point, the third waveform falls from the third voltage level to the fourth voltage level with one or more steps.

* * * * *